US012812852B2

(12) United States Patent
Huang et al.

(10) Patent No.: US 12,812,852 B2
(45) Date of Patent: Nov. 24, 2026

(54) MEMORY DEVICE AND MANUFACTURING METHOD THEREOF

(71) Applicant: Winbond Electronics Corp., Taichung City (TW)

(72) Inventors: Tzu-Yun Huang, Taichung City (TW); Chung-Hsien Liu, Taichung City (TW)

(73) Assignee: Winbond Electronics Corp., Taichung City (TW)

( * ) Notice: Subject to any disclaimer, the term of this patent is extended or adjusted under 35 U.S.C. 154(b) by 508 days.

(21) Appl. No.: 18/342,713

(22) Filed: Jun. 27, 2023

(65) Prior Publication Data

US 2024/0349499 A1 Oct. 17, 2024

(30) Foreign Application Priority Data

Apr. 13, 2023 (TW) ................................ 112113753

(51) Int. Cl.

*H10B 41/35* (2023.01)
*H10B 41/10* (2023.01)
*H10D 30/68* (2025.01)

(52) U.S. Cl.

CPC ............ *H10B 41/35* (2023.02); *H10B 41/10* (2023.02); *H10D 30/6891* (2025.01)

(58) Field of Classification Search

CPC ..... H10B 41/35; H10B 41/10; H10D 30/6891
See application file for complete search history.

(56) References Cited

U.S. PATENT DOCUMENTS

2011/0104883 A1 5/2011 Nagano
2015/0014762 A1 1/2015 Ohnuki
2015/0060986 A1 3/2015 Fujitsuka et al.
2022/0037503 A1* 2/2022 Yang ................ H01L 21/28202
2023/0328970 A1* 10/2023 Lai ...................... H10D 64/666
257/213

FOREIGN PATENT DOCUMENTS

CN 108346663 12/2020
KR 20130090505 8/2013

OTHER PUBLICATIONS

Machine translation of KR 2013-0090505, 2026.*
"Office Action of Taiwan Counterpart Application", issued on Nov. 30, 2023, p. 1-p. 11.

* cited by examiner

*Primary Examiner* — Richard A Booth
(74) *Attorney, Agent, or Firm* — JCIPRNET

(57) ABSTRACT

A memory device and a manufacturing method thereof are provided. The memory device includes: active regions, defined in a semiconductor substrate; word line structures, formed on the semiconductor substrate, and intersected with the active regions, wherein each of the word line structures includes a floating gate and a control gate stacked on the floating gate; first protection layers, respectively covering an upper part of the control gate in one of the word line structures, wherein a bottom end of the control gate in each word line structure is lower than a bottom end of each first protection layer; and a second protection layer, covering the first protection layers, and wrapping the word line structures.

7 Claims, 10 Drawing Sheets

MEMORY DEVICE AND MANUFACTURING METHOD THEREOF

CROSS-REFERENCE TO RELATED APPLICATION

This application claims the priority benefit of Taiwan application serial no. 112113753, filed on Apr. 13, 2023. The entirety of the above-mentioned patent application is hereby incorporated by reference herein and made a part of this specification.

BACKGROUND

Technical Field

The present disclosure relates to a semiconductor device and a manufacturing method thereof, and more particularly, to a memory device and a manufacturing method thereof.

Description of Related Art

Flash memory is non-volatile, and allows multiple times of data programming, reading and erasing. In particular, NAND flash memory has merit of high storage density, and is comprehensively used in various high capacity memory products. Along with development of NAND flash memory, line width of individual word line structure is reduced, and spacing between adjacent word line structures is shortened. This would increase difficulty in controlling shape of individual word line structure, and resistance-capacitance delay (RC delay) mutually resulted on adjacent word line structures would vary.

SUMMARY

In an aspect of the present disclosure, a memory device is provided. The memory device comprises: active regions, defined in a semiconductor substrate; word line structures, formed on the semiconductor substrate, and intersected with the active regions, wherein each of the word line structures comprises a floating gate and a control gate stacked on the floating gate; first protection layers, respectively covering an upper part of the control gate in one of the word line structures, wherein a bottom end of the control gate in each word line structure is lower than a bottom end of each first protection layer; and a second protection layer, covering the first protection layers, and wrapping the word line structures.

In another aspect of the present disclosure, a manufacturing method of a memory device is provided. The method comprises: sequentially stacking a first dielectric material layer, a first gate material layer, a second dielectric material layer and a second gate material layer on a semiconductor substrate; performing a first etching process to pattern an upper part of the second gate material layer into upper control gates; forming a protection material layer covering the upper control gates and a lower part of the second gate material layer; performing a second etching process to form trenches in between the upper control gates and extending through the protection material layer, the lower part of the second gate material layer, the second dielectric material layer, the first gate material layer and the first dielectric material layer, such that the protection material layer is patterned into first protection layers, the lower part of the second gate material layer is patterned into lower control gates, the second dielectric material layer is patterned into inter-gate dielectric layers, the first gate material layer is patterned into floating gates, and the first dielectric material layer is patterned into tunneling dielectric layers; and forming a second protection layer covering the first protection layers and extending along sidewalls of the lower control gates, the inter-gate dielectric layers, the floating gates and the tunneling dielectric layers.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1A:
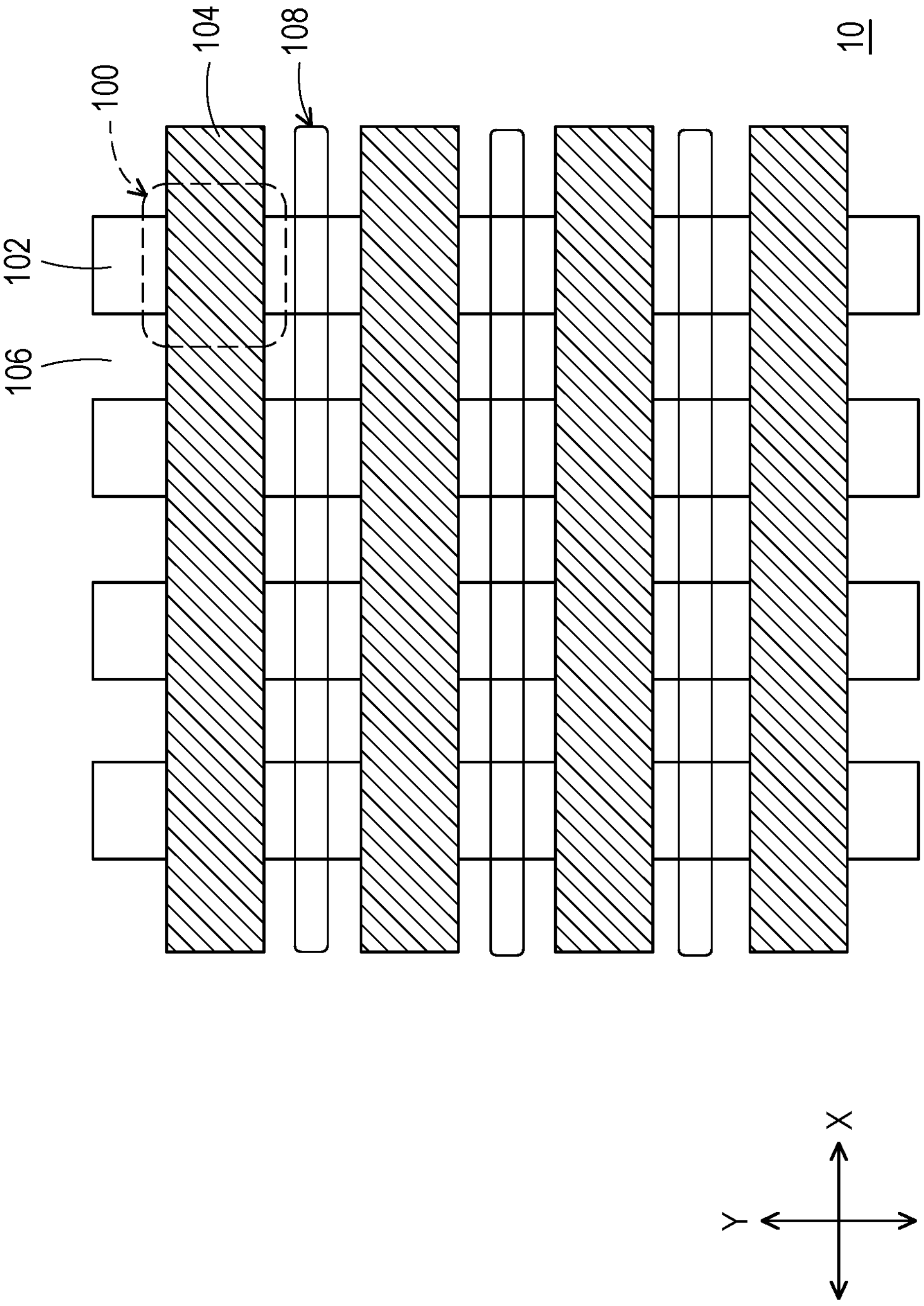
FIG. 1A is a schematic plan view illustrating a portion of a memory device according to some embodiments of the present disclosure.

FIG. 1A is a schematic plan view illustrating a portion of a memory device 10 according to some embodiments of the present disclosure. The memory device 10 is a NAND flash memory. As shown in FIG. 1A, the memory device 10 includes transistors 100 arranged in an array. Each transistor 100 is defined at an intersection of an active region 102 and a word line structure 104. The word line structure 104 provides a control gate and a floating gate for the transistor 100. In addition, portions of the active region 102 at opposite sides of the word line structure 104 provide source and drain for the transistor 100, and a portion of the active region 102 overlapped with the word line structure 104 is functioned as a channel of the transistor 100.

A plurality of the active regions 102 are intersected with a plurality of the word line structures 104, and a plurality of the transistors 100 are defined at intersections of the active regions 102 and the word line structures 104, respectively. The transistors 100 in the same column are arranged along the same active region 102, and are controlled by the intersected word line structures 104. On the other hand, the transistors 100 in the same row share the same word line structure 104, but are provided with sources, drains and channels by different active regions 102. In this way, the transistors 100 are arranged in strings. The transistors 100 in the same string are arranged along a column direction, and are connected in series. In addition, the word line structures 104 extending along a row direction can be shared by multiple strings of the transistors 100. In an embodiment, the column direction is a direction Y, whereas the row direction is a direction X.

Each active region 102 is a surface region of a semiconductor substrate, and adjacent active regions 102 are laterally spaced apart from each other by a trench isolation structure 106 formed into the semiconductor substrate. In addition, each active region 102 can be doped with N-type or P-type. On the other hand, the word line structures 104 extend over the semiconductor substrate. As will be described in greater details with respect to FIG. 1B, each word line structure 104 includes a stacking structure and protection layers covering surfaces of the stacking structure. Although not shown in FIG. 1A, a dielectric material can be filled in between adjacent word line structures 104. However, this dielectric material would not fill up the spacing, such that air gaps 108 respectively extend along the row direction (i.e., the direction X) in between adjacent word line structures 104. The air gaps 108 sealed in the dielectric material are near vacuum, and have an extremely low dielectric constant. Therefore, RC-delay mutually resulted on adjacent word line structures 104 can be reduced.

Figure 1B:
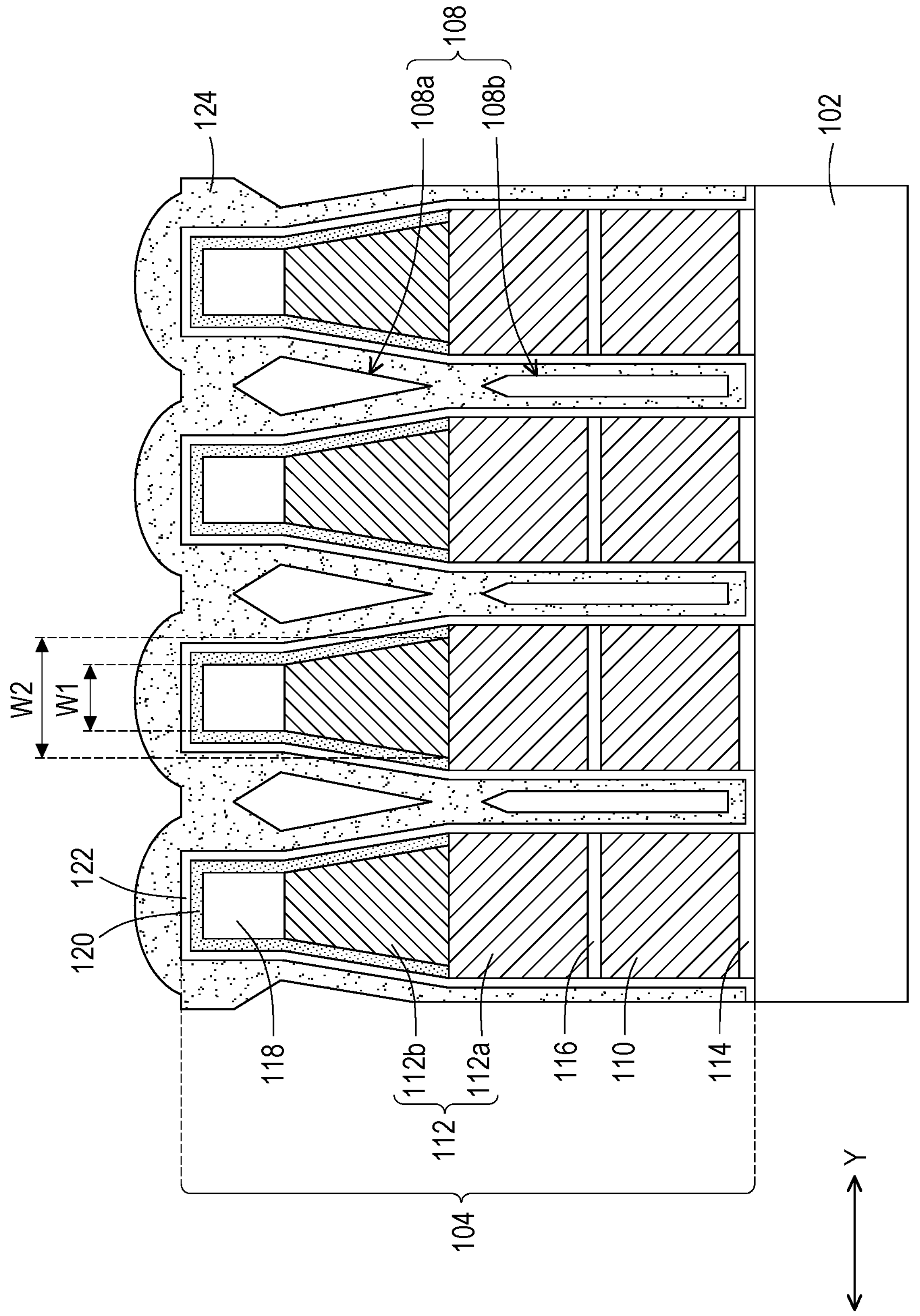
FIG. 1B is a schematic cross-sectional view along an active region shown in FIG. 1A.

FIG. 1B is a schematic cross-sectional view along an active region 102 shown in FIG. 1A. As shown in FIG. 1B, each active region 102 is intersected with multiple ones of the word line structures 104 lying above. Each word line structure 104 includes a floating gate 110 and a control gate 112 stacked on the floating gate 110, and includes a tunneling dielectric layer 114 extending between the floating gate 110 and the active region 102 as well as an inter-gate dielectric layer 116 extending in between the floating gate 110 and the control gate 112.

According to an embodiment, the control gate 112 includes a conductive layer 112*a* and a conductive layer 112*b*. The conductive layer 112*a* may be formed of a conductive material, whereas the conductive layer 112*b* may be formed of another conductive material. As an example, the conductive layer 112*a* and the floating gate 110 may be formed of polysilicon, and the conductive layer 112*b* may be a metal layer, such as a tungsten layer. In addition, according to an embodiment, a width of the conductive layer 112*b* gradually decreases toward the conductive layer 112*a*, such that a width W1 of a top end of the conductive layer 112*b* is less than a width W2 of a bottom end of the conductive layer 112*b*. On the other hand, a width of the conductive layer 112*a* barely decreases downwardly (as compared to the conductive layer 112*b*), and is slightly greater than the width W2 of the bottom end of the conductive layer 112*b*. In such embodiment, sidewalls of the conductive layer 112*a* may substantially coplanar with sidewalls of the underlying inter-gate dielectric layer 116, the floating gate 110 and the tunneling dielectric layer 114, and sidewalls of the conductive layer 112*b* gradually extend inwardly away from the sidewalls of the conductive layer 112*a*.

Each word line structure 104 may further include a capping layer 118 covering the control gate 112. In the embodiment where the control gate 112 includes the conductive layer 112*a* and the conductive layer 112*b*, the capping layer 118 may be in contact with the conductive layer 112*b*. Further, a width of a bottom end of the capping layer 118 may be substantially identical with the width W1 of the top end of the conductive layer 112*b*. In the embodiment where the width of the conductive layer 112*b* gradually decreases from bottom to top (as shown in FIG. 1B), the width of the capping layer 118 barely decreases from bottom to top of the capping layer 118 (as compared to the conductive layer 112*b*), and sidewalls of the capping layer 118 are not coplanar with the sidewalls of the conductive layer 112*b*. Alternatively, the width of the capping layer 118 may gradually decrease from bottom to top of the capping layer 118, and the sidewalls of the capping layer 118 may be substantially coplanar with the sidewalls of the conductive layer 112*b*. In addition, although top edges of the capping layer 118 are depicted as straight edges, the top edges of the capping layer 118 may otherwise be rounded edges or beveled edges.

The stacking structure of each word line structure 104 that includes the capping layer 118, the control gate 112, the inter-gate dielectric layer 116, the floating gate 110 and the tunneling dielectric layer 114 is covered by at least two protection layers. The control gate 112 has an upper part (or referred to as an upper control gate) and a lower part (or referred to as a lower control gate). A protection layer 120 conformally covers surfaces of the upper part of the control gate 112 and the capping layer 118, and a bottom end of the control gate 112 is lower than a bottom end of the protection layer 120. In the embodiment where the control gate 112 includes the conductive layer 112*a* and the conductive layer 112*b*, the protection layer 120 covers the sidewalls of the conductive layer 112*b* and the sidewalls as well as a top surface of the capping layer 118, but does not cover the sidewalls of the conductive layer 112*a*. Moreover, the bottom end of the protection layer 120 is in contact with the conductive layer 112*a* from above, and the sidewalls of the conductive layer 112*a* continuously extend to sidewalls of the overlying protection layer 120. As a result, the width of the conductive layer 112*a* is proximately a summation of the width W2 of the bottom end of the conductive layer 112*b* and two times of a thickness of the protection layer 120.

A protection layer 122 covers the protection layer 120, and entirely wraps the stacking structure including the capping layer 118, the control gate 112, the inter-gate dielectric layer 116, the floating gate 110 and the tunneling dielectric layer 114. That is, the protection layer 122 extends along surfaces of the protection layer 120, and may be in contact with the capping layer 118 and the upper part of the control gate 112 through the protection layer 120. In addition, the protection layer 122 may be in direct contact with sidewalls of the lower part of the control gate 112, the inter-gate dielectric layer 116, the floating gate 110 and the tunneling dielectric layer 114. In the embodiment where the control gate 112 includes the conductive layer 112*a* and the conductive layer 112*b*, the protection layer 122 is in contact with the protection layer 112*b* through the protection layer 120, and may be in direct contact with the conductive layer 112*a*.

The protection layer 120 and the protection layer 122 may be respectively formed of an insulating material. In an embodiment, the protection layer 120 and the protection layer 122 are formed of the same insulating material. In an alternative embodiment, the protection layer 120 and the protection layer 122 are formed of different insulating materials. As examples, the insulating materials for forming the protection layer 120 and the protection layer 122 may respectively include silicon oxide, silicon nitride, silicon oxynitride, silicon carbide, silicon oxycarbide or combinations thereof.

A plurality of the protection layers 120 cover top portions of a plurality of the word line structures 104 respectively, and are laterally separated from one another. On the other hand, a single protection layer 122 formed over the semiconductor substrate may cover all of the word line structures 104, and extend in between adjacent word line structures 104. As shown in FIG. 1B, the protection layer 122 extends along portions of the active region 102 in between adjacent word line structures 104.

A dielectric material 124 is filled in between adjacent word line structures 104, and covers top surfaces of the word line structures 104. By process control, the dielectric material 124 would not fill up spacing between adjacent word line structures 104. In this way, the air gaps 108 are sealed in portions of the dielectric material 124 in between adjacent word line structures 104. In the embodiment where the conductive layer 112*b* of the control gate 112 is tapered upwardly, the air gaps 108 may respectively include an upper air gap 108*a* and a lower air gap 108*b* separated from the upper air gap 108*a*. A top end of the upper air gap 108*a* may be located in between adjacent capping layers 118, and a bottom end of the upper air gap 108*a* may be located in between adjacent conductive layers 112*b*. Further, the upper air gap 108*a* may have a maximum width at a height substantially leveled with top surfaces of the conductive layers 112*b*, and may taper downwardly from the height of the maximum width. On the other hand, a top end of the lower air gap 108*b* may be located between adjacent conductive layers 112*a*, and a bottom end of the lower air gap 108*b* may be located between adjacent floating gates 110. According to an embodiment, the lower air gap 108*b* has a top portion tapered upwardly, and rest portions with substantially constant width. However, shapes of the upper air gap 108*a* and the lower air gap 108*b* may vary according to process parameters, the present disclosure is not limited thereto. By forming the air gaps 108 in between adjacent word line structures 104, RC-delay mutually resulted on adjacent word line structures 104 can be reduced.

Although not shown, the memory device 10 may further include other components. For instance, selection transistors may be disposed at opposite ends of each active region 102, to control voltage difference between the opposite ends of each active region 102. In this way, the transistors 100 in each string may be serially connected between a pair of the selection transistors. In addition, more conductive features and insulating layers may be formed on the dielectric material 124, and the conductive features can provide routings for the memory device 10.

Figure 2:
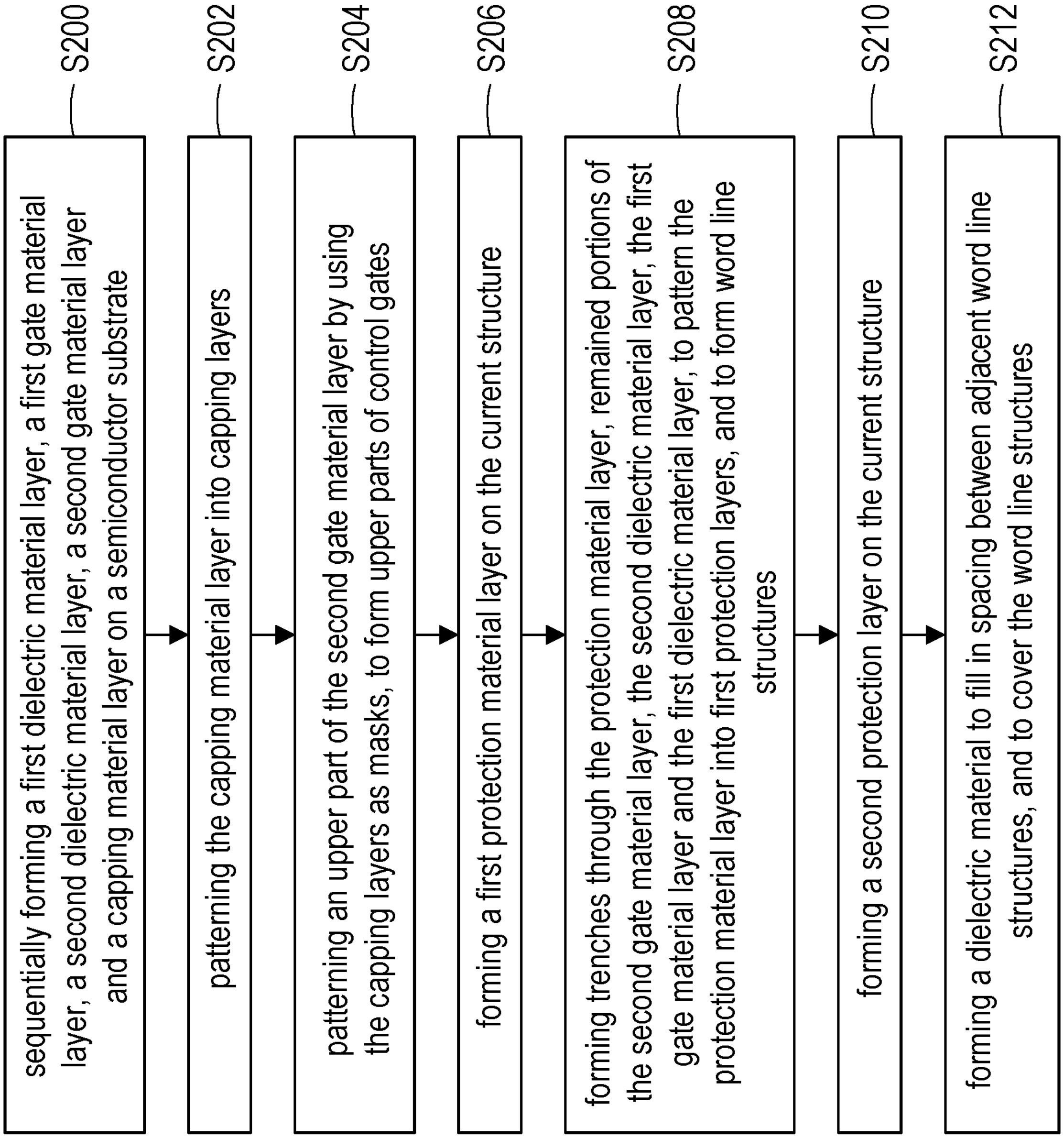
FIG. 2 is a flow diagram illustrating a method for manufacturing the memory device shown in FIG. 1A and FIG. 1B, according to some embodiments of the present disclosure.

FIG. 2 is a flow diagram illustrating a method for manufacturing the memory device 10, according to some embodiments of the present disclosure. FIG. 3A through FIG. 3F are schematic cross-sectional views along one of the active regions 102 in intermediate structures at various stages during the manufacturing process shown in FIG. 2.

Figure 3A:
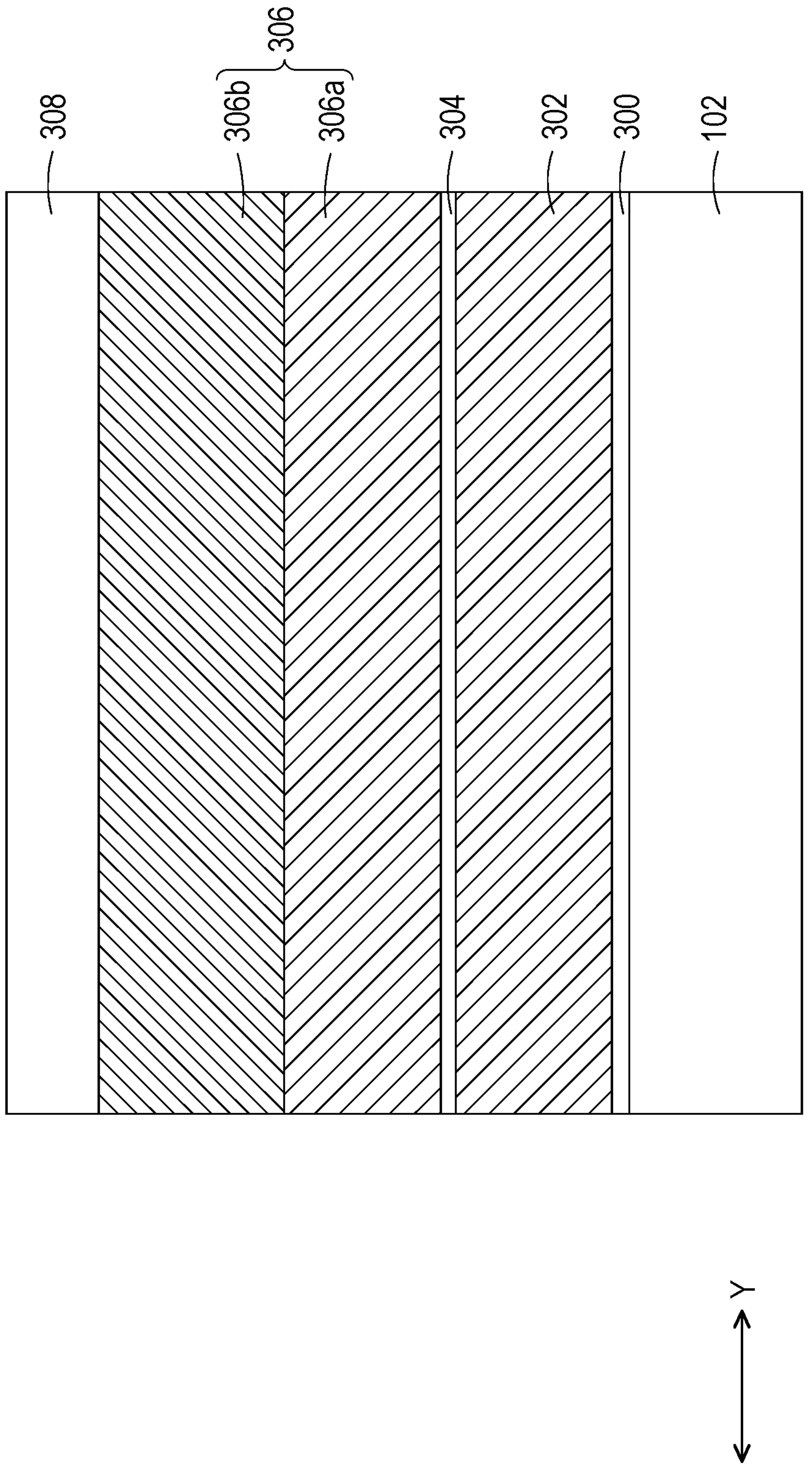
FIG. 3A through FIG. 3F are schematic cross-sectional views along an active region in intermediate structures at various stages during the manufacturing process shown in FIG. 2.

Referring to FIG. 2 and FIG. 3A, at a step S200, a dielectric material layer 300, a gate material layer 302, a dielectric material layer 304, a gate material layer 306 and a capping material layer 308 are sequentially formed on the semiconductor substrate to cover each active region 102. In the embodiment where the control gate 112 includes the conductive layer 112*a* and the conductive layer 112*b*, the gate material layer 306 may include a conductive material layer 306*a* and a conductive material layer 306*b*.

Figure 3B:
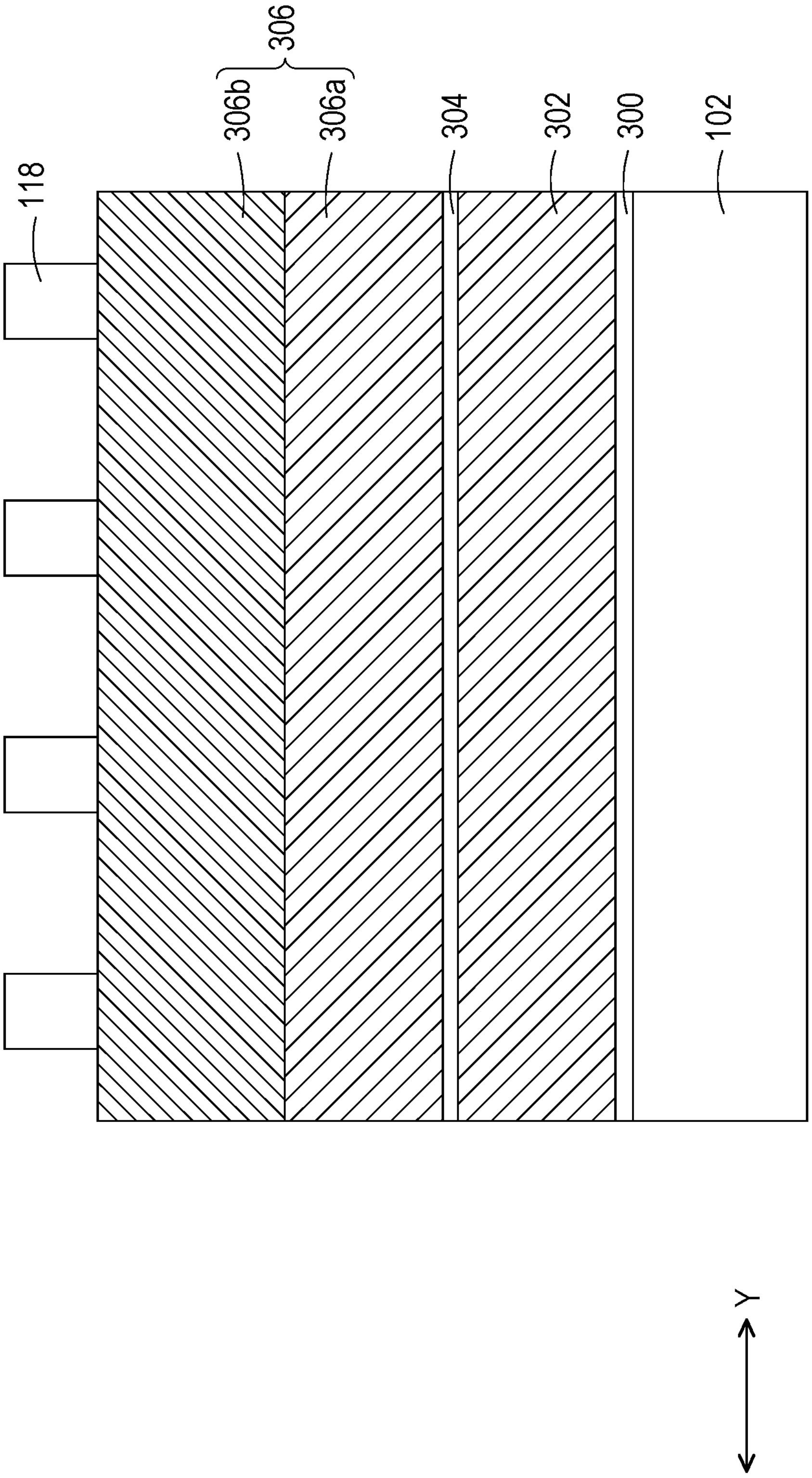

Referring to FIG. 2 and FIG. 3B, at a step S202, the capping material layer 308 is patterned into the capping layers 118. In subsequent steps, the capping layers 118 may be functioned as masks while etching the gate material layer 306, the dielectric material layer 304, the gate material layer 302 and the dielectric material layer 300, to define the word line structures 104. That is, locations and dimensions of the capping layers 118 define locations and dimensions of the word line structures 104.

Figure 3C:
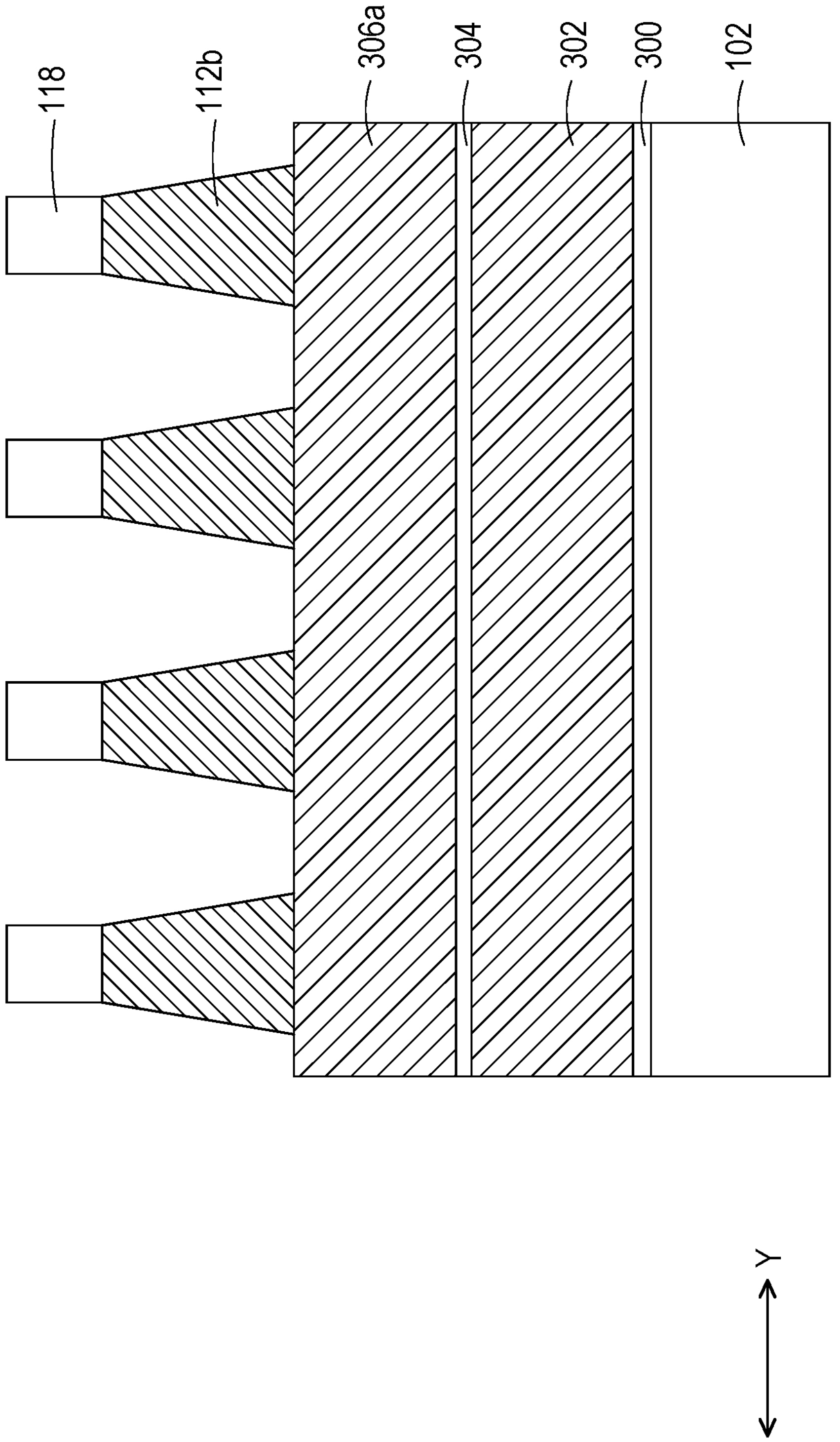

Referring to FIG. 2 and FIG. 3C, at a step S204, an upper part of the gate material layer 306 is patterned by using the capping layers 118 as masks, to form the upper parts of the control gates 112. In the embodiment where the gate material layer 306 includes the conductive material layer 306*a* and the conductive material layer 306*b*, the conductive material layer 306*b* is currently patterned into the conductive layers 112*b* as the upper parts of the control gates 112. On the other hand, the conductive layer 306*a* is not patterned yet. As an example, an anisotropic etching process (or referred to as a first etching process) may be used for implementing the patterning of the conductive material layer 306*b*. During the first etching process, portions of the conductive material layer 306*b* not shielded by the capping layers 118 are removed, whereas portions of the conductive material layer 306*b* covered by the capping layers 118 are remained to form the conductive layers 112*b*. Further, the first etching process may be stopped upon exposure of the conductive material layer 306*a*, to avoid from patterning the conductive material layer 306*a* in the current step. According to an embodiment, by controlling etching parameters, the width of the conductive layers 112*b* gradually increases from top to bottom, and the conductive layers 112*b* are formed with tapered sidewalls.

Figure 3D:
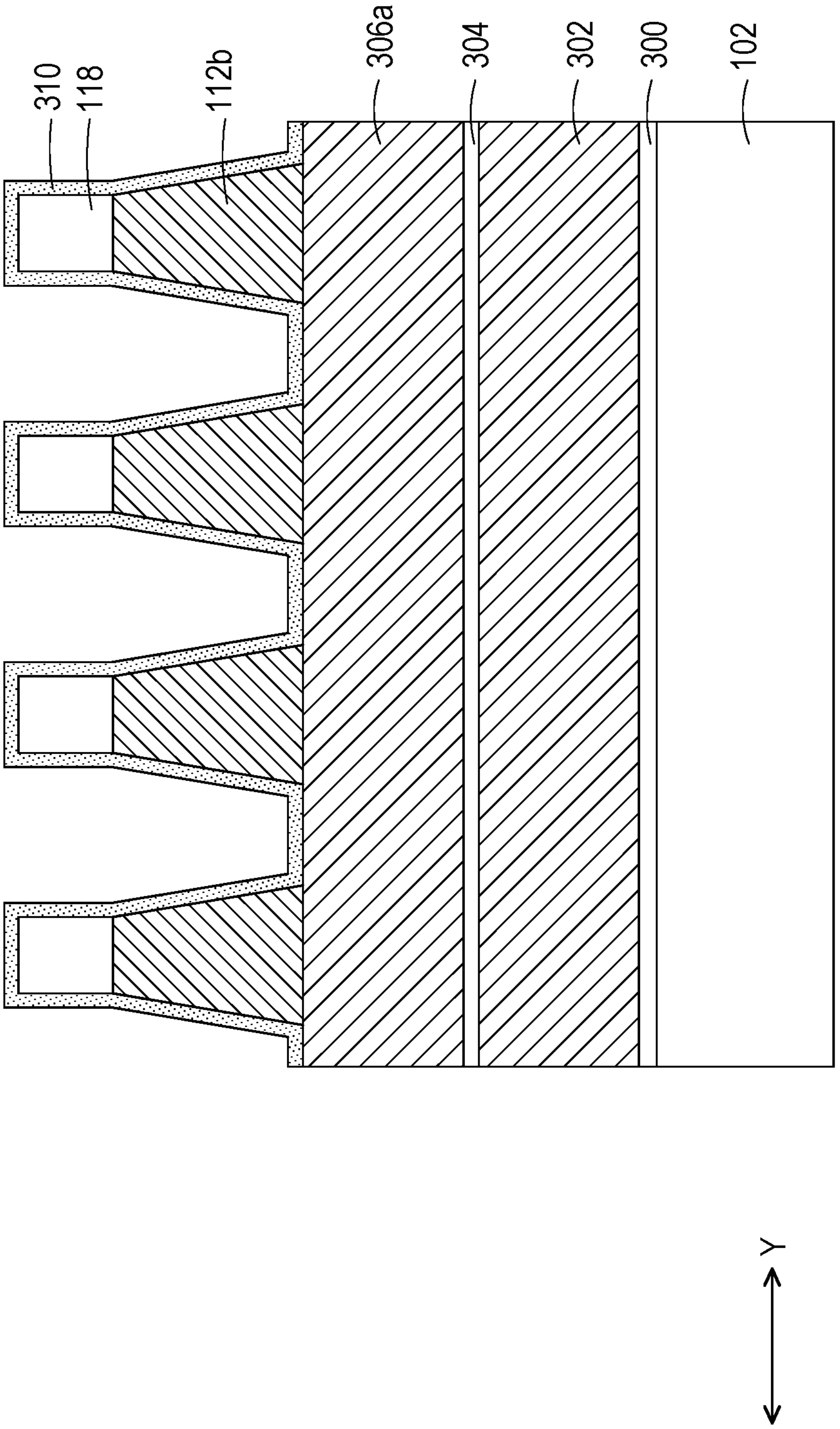

Referring to FIG. 2 and FIG. 3D, at a step S206, a protection material layer 310 is formed on the current structure. The protection material layer 310 conformally covers remained portions of the gate material layer 306 and the overlying protruding structures. According to an embodiment, the remained portions of the gate material layer 306 include the conductive material layer 306*a*, and the protruding structures include the capping layers 118 and the conductive layers 112*b*. In such embodiment, the protection material layer 310 extends along portions of the conductive material layer 306*a* in between adjacent conductive layers 112*b*, and conformally covers surfaces of the conductive layers 112*b* and the overlying capping layers 118.

Figure 3E:
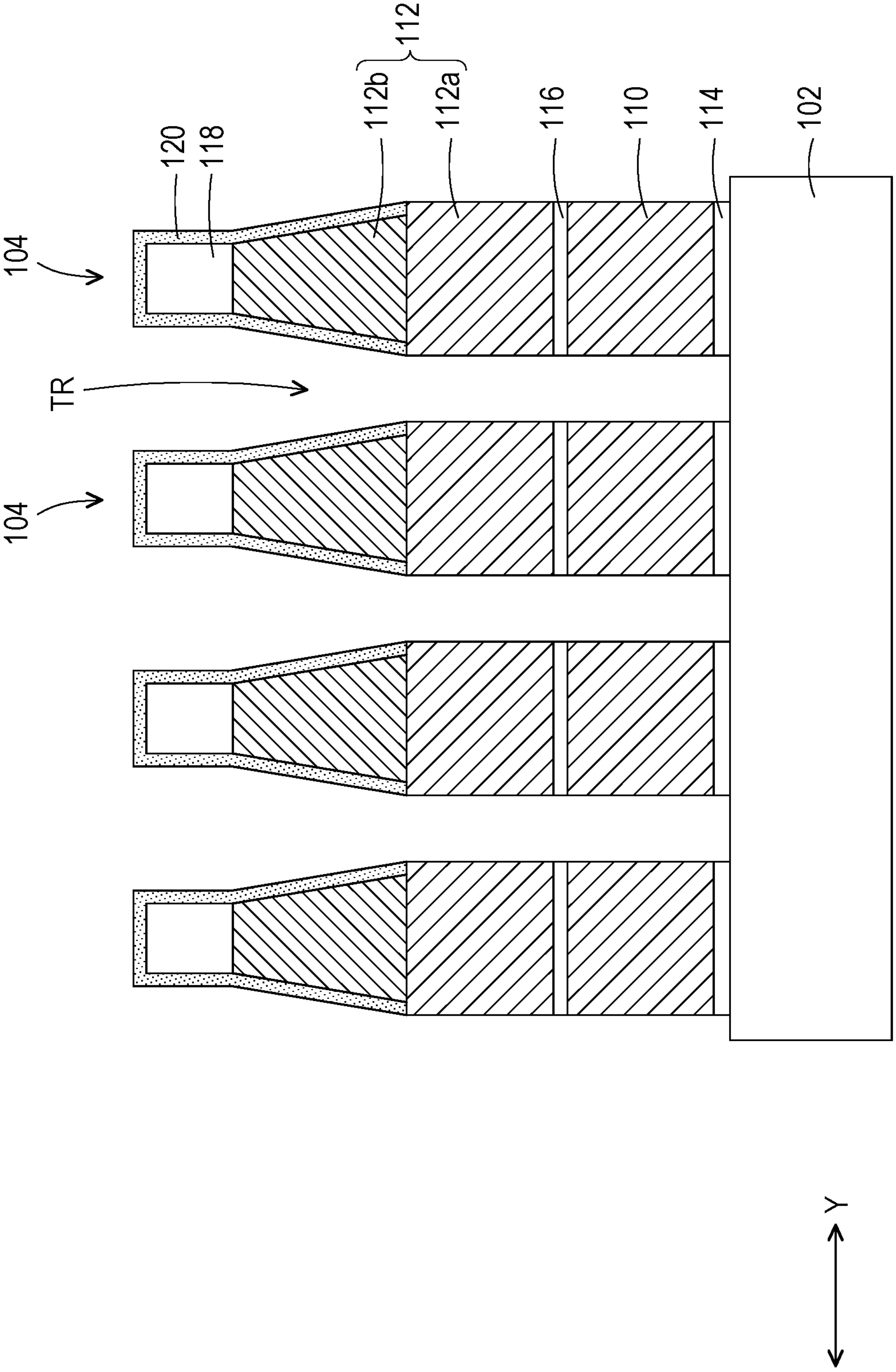

Referring to FIG. 2 and FIG. 3E, at a step S208, trenches TR are formed through the protection material layer 310, the remained portions of the gate material layer 306, the dielectric material layer 304, the gate material layer 302 and the dielectric material layer 300. Accordingly, patterning of the word line structures 104 has been implemented. Specifically, in the current step, previously remained portions of the gate material layer 306 are patterned into the lower parts of the control gates 112, the dielectric material layer 304 is patterned into the inter-gate dielectric layers 116, the gate material layer 302 is patterned into the floating gates 110, and the dielectric material layer 300 is patterned into the tunneling dielectric layers 114. Further, remained portions of the protection material layer 310 form the protection layers 120.

As an example, another anisotropic etching process (also referred to as a second etching process) may be used for forming the trenches TR and implementing patterning of the word line structures 104. During the second etching process, portions of the protection material layer 310 extending along the lower part of the gate material layer 306 are removed, such that remained portions of the protection material layer 310 form the protection layers 120 wrapping the upper parts of the control gates 112 (e.g., the conductive layers 112*b*) and the capping layers 118. Subsequently, the lower part of the gate material layer 306 (e.g., the conductive material layer 306*a*), the dielectric material layer 304, the gate material layer 302 and the dielectric material layer 300 are cut through in between the protection layers 120, to form the trenches TR and complete patterning of the word line structures 104. Meanwhile, the upper parts of the control gates 112 (e.g., the conductive layers 112*b*) and the capping layers 118 are shielded by the protection layers 120, thus can be avoided from being shaped during the second etching process. Therefore, shape and resistivity of each control gate 112 can be more effectively controlled, and spacing between the control gates 112 can be more precisely managed.

Figure 3F:
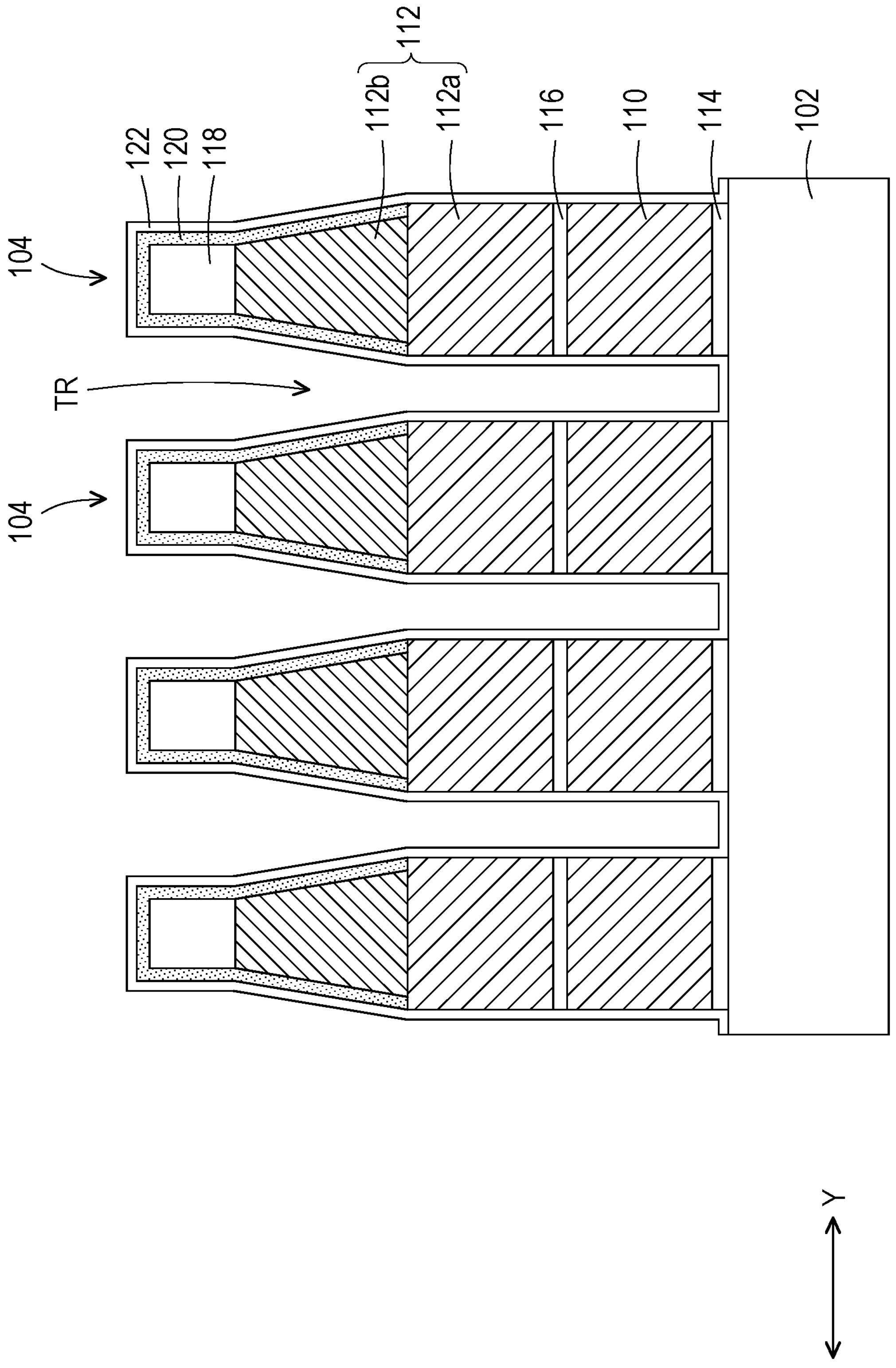

Referring to FIG. 2 and FIG. 3F, at a step S210, the protection layer 122 is formed on the current structure. The protection layer 122 conformally covers the current structure. Accordingly, the protection layers 120 are covered by the protection layer 122. In addition, sidewalls and bottom surfaces of the trenches TR are lined by the protection layer 122. Further, the word line structures 104 are entirely wrapped by the protection layer 122, and the protection layer 122 further extends along portions of the active region 102 located between adjacent word line structures 104.

Referring to FIG. 2 and FIG. 1B, at a step S212, a dielectric material 124 is formed to fill the trenches TR between the word line structures 104, and to cover the word line structures 104. By process control, the dielectric material 124 does not fill up the trenches TR, and the air gaps 108 are sealed in between adjacent word line structures 104. In the embodiment where the upper parts of the control gates 112 (e.g., the conductive layers 112*b*) taper upwardly, the dielectric material 124 is prone to accumulate at a height leveled with bottom ends of the upper parts of the control gates 112. In such embodiment, each air gap 108 is likely to be divided into the upper air gap 108*a* and the lower air gap 108*b* separated from the upper air gap 108*a*.

Figure 4:
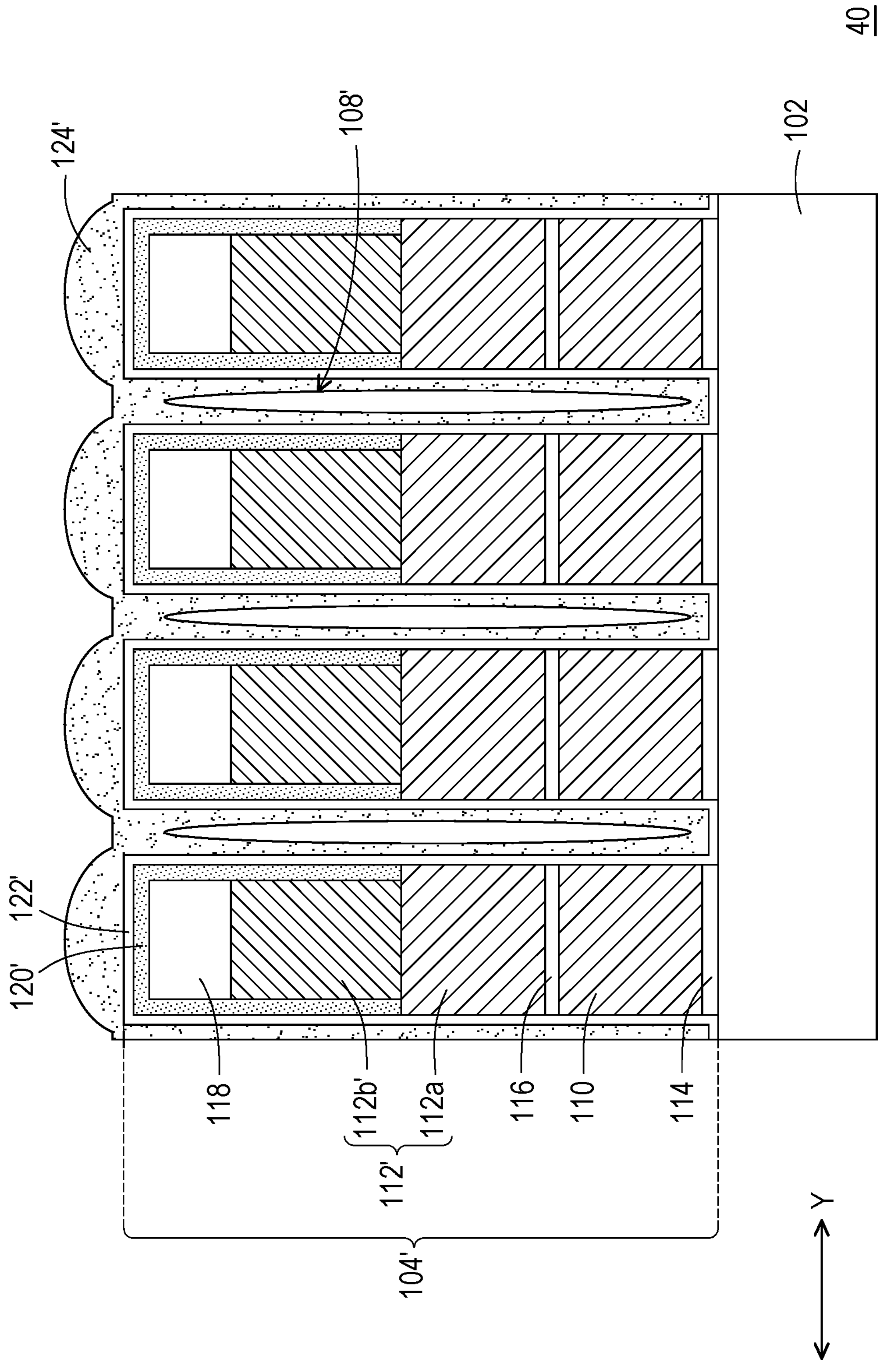
FIG. 4 is a schematic cross-sectional view illustrating an active region of a memory device according to other embodiments of the present disclosure.

FIG. 4 is a schematic cross-sectional view illustrating an active region 102 of a memory device 40 according to other embodiments of the present disclosure. The memory device 40 is similar to the memory device 10 described with reference to FIG. 1A and FIG. 1B. Only differences between the memory devices 40, 10 will be described, and the like or the same parts of the memory devices 40, 10 would not be repeated again. As shown in FIG. 4, each word line structure 104' in the memory device 40 includes a control gate 112' on the inter-gate dielectric layer 116. The control gate 112' includes the conductive layer 112*a* and a conductive layer 112*b*' stacked on the conductive layer 112*a*. As compared to the conductive layer 112*b* described with reference to FIG. 1B, the conductive layer 112*b*' shown in FIG. 4 has relatively vertical sidewalls. This results that a top width of the conductive layer 112*b*' is substantially equal with a bottom width of the conductive layer 112*b*'. As the conductive layers 112*b*' has relatively vertical sidewalls, protection layers 120' extending along the sidewalls of the conductive layer 112*b*' may have rather vertically extending surfaces (as compared to the protection layers 120 shown in FIG. 1B). Accordingly, sidewalls of the conductive layers 112*a*, the inter-gate dielectric layers 116, the floating gates 110 and the tunneling dielectric layers 114 may be substantially coplanar with the vertically extending surfaces of the protection layers 120'. Further, a protection layer 122' covering the protection layers 120' may have rather vertically extending surfaces (as compared to the protection layer 122 shown in FIG. 1B) as well.

As a result, the spacing between adjacent word line structures 104' is not likely to have a necking portion at a height leveled with bottom ends of the conductive layers 112*b*', but have substantially constant width from top to bottom. Accordingly, air gaps 108' sealed in a dielectric material 124' and located between adjacent word line structures 104' may not be respectively divided into separated upper and lower parts, but continuously extend along a vertical direction. A top end of each air gap 108' is higher than bottom ends of the control gates 112' at opposite sides, and a bottom end of each air gap 108' is lower than the bottom ends of the control gates 112' at opposite sides. According to an embodiment, the top end of each air gap 108' may be located in between adjacent capping layers 118, and the bottom end of each air gap 108' may be located in between adjacent floating gates 110.

The manufacturing method described with reference to FIG. 2 and FIG. 3A through FIG. 3F can be used for forming the memory device 40 shown in FIG. 4, except that etching parameters of the first etching process for forming the conductive layers 112*b*' of the control gates 112' can be adjusted, such that the conductive layers 112*b*' are formed with rather vertical sidewalls. In subsequent steps, the protection layers 120', the conductive layers 112*a* of the control gates 112', the inter-gate dielectric layers 116, the floating gates 110, the tunneling dielectric layers 114, the protection layer 122' and the dielectric material 124' having the air gaps 108' are accordingly formed.

As above, a memory device and a manufacturing method thereof are provided. The memory device includes active regions defined in a semiconductor substrate, and includes word line structures located on the semiconductor substrate and intersected with each of the active regions. Each word line structure includes a tunneling dielectric layer, a floating gate, an inter-gate dielectric layer and a control gate, from bottom to top. In addition, first protection layers cover upper parts of the control gates, and a second protection layer covers the first protection layers and entirely wraps the word line structures. During manufacturing, at least two etching processes are used for patterning the control gates. A first etching process is performed for patterning the upper parts of the control gates, whereas a second etching process is performed for patterning the lower parts of the control gates. Further, the first protection layers covering the upper parts of the control gates are formed after the first etching process and before the second etching process, such that the upper parts of the control gates can be protected by the first protection layers during the second etching process. In this way, the upper parts of the control gates can be avoided from being shaped during the second etching process. Therefore, shape of each control gate and spacing between adjacent word line structures can be more precisely controlled. According to an embodiment, the upper part of each control gate tapers from bottom to top. In such embodiment, air gaps sealed in a dielectric material filled in between the word line structures are respectively divided into separated upper and lower parts. In an alternative embodiment, the upper parts of the control gates have substantially vertical sidewalls. In this alternative embodiment, the air gaps may continuously extend along a vertical direction, rather than being respectively divided into separated upper and lower parts.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A memory device, comprising:

active regions, defined in a semiconductor substrate;

word line structures, formed on the semiconductor substrate, and intersected with the active regions, wherein each of the word line structures comprises:

a floating gate;

a control gate, stacked on the floating gate; and a tunneling dielectric layer located between the floating gate and the corresponding active region;

first protection layers, respectively covering an upper part of the control gate in one of the word line structures, wherein a bottom end of the control gate in each word line structure is lower than a bottom end of each first protection layer; and a second protection layer, covering the first protection layers, and wrapping the word line structures, wherein the second protection layer covers sidewalls of the control gate, the floating gate, and the tunneling dielectric layer in each word line structure, wherein the upper part of the control gate in each word line structure tapers upwardly, wherein a dielectric material filled in between the word line structures has air gaps, each air gap is located between adjacent ones of the word line structures, and has an upper air gap and a lower air gap vertically separated from each other.

2. The memory device according to claim 1, wherein each first protection layer partially covers the control gate of one of the word line structures.

3. The memory device according to claim 1, wherein the bottom end of each first protection layer is in contact with the lower part of the control gate in one of the word line structures from above.

4. The memory device according to claim 3, wherein sidewalls of the lower part of the control gate in each word line structure are not covered by any of the first protection layers.

5. The memory device according to claim 3, wherein the upper part and the lower part of the control gate in each word line structure are a metal layer and a polysilicon layer, respectively.

6. The memory device according to claim 1, wherein a bottom end of the upper air gap of each air gap is located between the upper parts of the control gates in adjacent ones of the word line structures, and a top end of the lower air gap of each air gap is lower than the upper parts of the control gates in adjacent ones of the word line structures.

7. The memory device according to claim 1, wherein the second protection layer has portions laterally extending in between the word line structures.

* * * * *